United States Patent [19]

Bolton et al.

[11] Patent Number: 5,168,424

[45] Date of Patent: Dec. 1, 1992

[54] MULTI UNIT ELECTRICAL APPARATUS WITH DUAL INLET FAN POSITIONED OPPOSITE UNIT BAYS

[75] Inventors: Ivor W. Bolton; Frank E. Castle, both of Winchester; David S. Gaunt, Southampton, all of England

[73] Assignee: International Business Machines Corporation, Armonk, N.Y.

[21] Appl. No.: 655,710

[22] Filed: Feb. 14, 1991

[30] Foreign Application Priority Data

Feb. 15, 1990 [GB] United Kingdom ............... 9003472

[51] Int. Cl.$^5$ ........................... H05K 7/20; H05K 5/02
[52] U.S. Cl. ................................... 361/384; 361/391; 361/394; 165/122
[58] Field of Search ............... 165/122; 361/384, 390, 361/391, 392, 393, 394, 395, 399, 415; 364/708

[56] References Cited

U.S. PATENT DOCUMENTS

| | | | |
|---|---|---|---|
| 2,789,024 | 4/1957 | Heisler | 361/391 X |
| 3,270,253 | 8/1966 | Binder et al. | 361/391 |
| 3,448,346 | 6/1969 | Webb | 361/391 X |
| 3,592,260 | 7/1971 | Berger | 361/384 X |
| 4,648,007 | 3/1987 | Gamer | 361/384 |
| 4,660,125 | 4/1987 | Purdy et al. | 361/391 |
| 4,739,444 | 4/1988 | Zushi et al. | 361/383 |
| 4,748,540 | 5/1988 | Heinzeberg et al. | 361/415 X |
| 4,901,200 | 2/1990 | Mazura | 361/384 X |

FOREIGN PATENT DOCUMENTS

| | | |
|---|---|---|
| 1131689 | 10/1968 | European Pat. Off. . |
| 1318986 | 5/1973 | European Pat. Off. . |
| 0320107 | 6/1989 | European Pat. Off. . |
| 0320720 | 6/1989 | European Pat. Off. . |
| 0328260 | 8/1989 | European Pat. Off. . |
| 2133082A | 7/1984 | United Kingdom . |
| 2210416 | 12/1988 | United Kingdom . |

OTHER PUBLICATIONS

"Gate/Shutter Airflow Control Device", IBM Technical Disclosure Bulletin, vol. 32, No. 3A, Aug. 1989.
Inter-Noise Conference Proceedings Dec. 1989, Newport Beach, U.S. pp. 151-156 David S. Gaunt: "The Design and Development of a Low Noise DC Motor Driven Centrifugal Fan".
Electronic Packaging and Production, vol. 30, No. 2, 1 Feb. 1990, Newton, Mass. U.S. pp. 181-185; Timothy S. Burke: "Forced Air Keeps Electronics Cool".

*Primary Examiner*—Leo P. Picard
*Assistant Examiner*—Michael W. Phillips
*Attorney, Agent, or Firm*—Roy W. Truelson; John L. Jackson

[57] ABSTRACT

Electrical apparatus is described which may include one or more electrical devices, each being located in a corresponding one of a plurality of device positions defined in a first section of a housing. The system further includes at least one dual side entry brushless dc motor driven centrifugal fan positioned such that each side entry is opposite a device position, and a power supply unit. In operation, the fans provide forced air cooling of the devices and power supply. Each of the devices is selected from a plurality of possible device types, each device type presenting a different impedance to the flow of cooling air.

12 Claims, 5 Drawing Sheets

MULTI UNIT ELECTRICAL APPARATUS WITH DUAL INLET FAN POSITIONED OPPOSITE UNIT BAYS

BACKGROUND OF THE INVENTION

This invention relates to multi unit electrical apparatus with forced air cooling.

Multi unit electrical systems are commonly employed to allow the user to tailor a system to his own requirements. A typical application of such a multi unit system is in the field of mass data storage. Typically, a plurality of data storage devices such as magnetic disk drives, are mounted in a box which also incorporates cooling fans and a power supply. The data storage devices may be used together to provide higher reliability by, for example, allowing duplication of information, or else to increase storage capacity. If the storage devices are removable this has the added advantage of allowing the user to remove and replace defective devices, or to lock away devices containing especially sensitive information. However, enclosing one or more devices and power supply within a single box imposes restrictions on the ability to maintain the devices and power supply within safe operating temperatures. Thus forced air cooling will usually be necessary.

An example of such a data storage system is described in European Patent Application number 320 107 in which five 5.25 inch disk drives are removably mounted in the front of a drawer, the rear of which contains a power supply. Cooling of the power supply and devices is provided by two axial fans fixed into the rear bulkhead of the drawer which pull air past the devices and over the power supply.

A second example is described in European Patent Application number 328 260, in which two customer removable data storage units in canisters are mounted in the front of a drawer. A power supply is located at the rear of the drawer separated from the devices by an internal bulkhead in which are located two axial fans for providing forced air cooling. While different device types may be mounted inside a common canister, no provision for devices having different cooling requirements is described in the application.

The reliability of a cooling system is important. European Patent Application number 320 720 describes a computer cooling system using two centrifugal fans, both of which normally operate at reduced capacity. A control system automatically detects the failure of one fan and increases the speed of the other, to maintain a substantially constant flow of cooling air through the computer.

Removal of one or more devices would also cause an imbalance in the air flow. IBM Technical Disclosure Bulletin ("Gate/Shutter Airflow Control Device", August 1989 pp 346-347) describes the use of a shutter which blocks off holes in a bulkhead when there is no device in that position.

SUMMARY OF THE INVENTION

In multi device drawers the user can choose the type and number of devices, and therefore the number and position of different devices can vary within a unit. In this type of drawer, the unit airflow characteristics will also vary. This can result in uneven cooling of the devices and the power supply to the rear of the devices. Each device may be provided with its own dedicated fan which may be tunable in terms of speed and air flow rate to the cooling requirements of its device. This however would be an expensive and time consuming operation and would tend to dictate against the use of such a cooling system where device interchangeability is required.

Accordingly the invention provides electrical apparatus including: a housing including receiving means located at one side thereof, adapted to receive multiple interchangeable electrical units; fan means behind the receiving means for producing an air flow through the housing past such electrical units; and a power supply also located in the air flow path through the housing; the apparatus being characterised in that the fan means includes an open loop brushless direct current centrifugal fan.

It is preferred that the power supply and the receiving means are located on opposite sides of the fan means. Preferably the receiving means are substantially coextensive with one end of the housing.

While the units may be mounted directly into the housing, it is preferred that the receiving means includes a number of bays thereby defining each electrical unit's position. Preferably dividing walls are included, terminating in a plenum, so that each bay may act as a duct for the passage of cooling air from outside into the housing.

While dc centrifugal fans having single entry apertures would be useful in this invention, it is preferred that each fan has two side entry apertures. In a preferred embodiment the fans are mounted such that each aperture is in line with a bay, each fan being thus associated with two bays.

The use of one or more open loop dc centrifugal fans in a housing having this geometrical configuration provides an efficient and versatile method of cooling the units and power supply. The speed of an open loop centrifugal brushless dc fan (distinct from the fan described in EP 320 720) varies with back pressure and because the fans are located adjacent to the receiving means, as the impedance presented by the unit or units in the receiving means decreases, then so does the back pressure. This results in a decrease in fan speed and hence of fan noise. Apparatus with this type of housing and cooling arrangement would find use in a variety of different environments. In one configuration all the units are of the same type, for example magnetic disk drives. If one set of units is replaced with a second set having lower air flow impedance the overall air flow through the housing increases while the speed and noise of the fans automatically decreases. This would be especially useful in the case where the low impedance units were intrinsically noisier than the high impedance units. The higher unit noise would be offset by the lower fan noise. The aerodynamic component of fan noise depends on the sixth power of the fan rpm and thus a small decrease in fan speed can give rise to a significant decrease in noise.

The same principle is equally applicable in a preferred electrical apparatus containing at least two different unit types presenting different impedances to the flow of cooling air.

Interchangeable units provide one mechanism whereby the fan input impedance may vary; another example of such a mechanism is seen in an apparatus having flexible cabling, such as ribbon cabling, passing near to the fan inlet. A cable may partially or wholly block a fan inlet, thereby increasing the fan back pressure. In the present invention, the fan would speed up, helping to maintain the overall flow of cooling air.

BRIEF DESCRIPTION OF THE DRAWINGS

In order that the invention may be fully understood a preferred embodiment thereof will now be described, by way of example only. The preferred embodiment is a multi-unit data storage system, and will be described with reference to the accompanying drawings in which.

DETAILED DESCRIPTION

Figure 1:
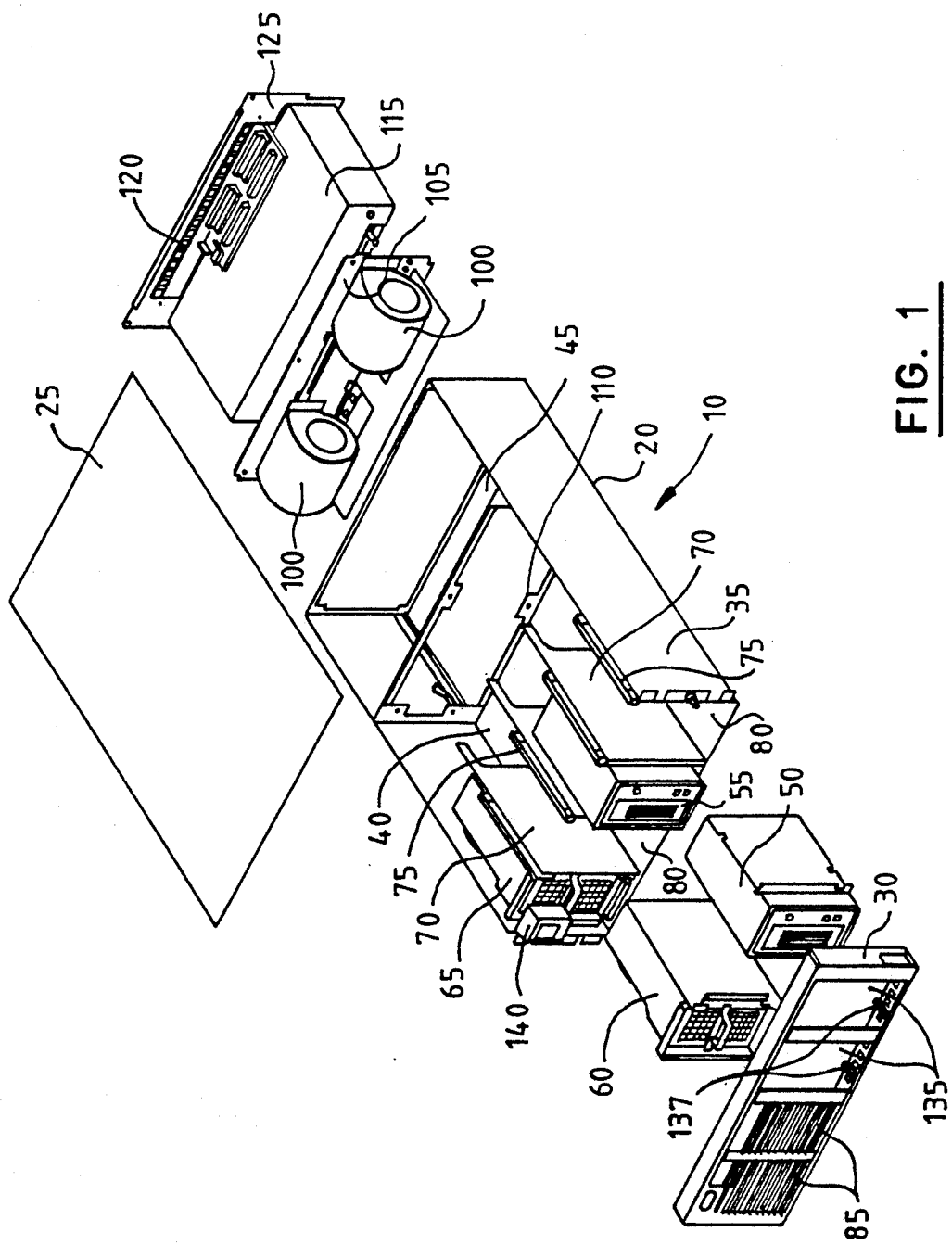
FIG. 1 is an exploded isometric view of a data storage system, being an example of an electrical apparatus according to the present invention.

Refer now to FIG. 1 which shows an exploded isometric view of a data storage system. This system is an example of an electrical apparatus according to the present invention.

The component parts of the data storage system 10 are mounted on a chassis 20. The chassis 20 comprises a drawer which fits into a standard 19-inch (483 mm) wide rack, and which, in operation, is covered by a permanently mounted lid 25. The system includes a power switch and indicator lamp 140 fixed at the front left side of the drawer.

The chassis 20 may be considered as three sections 35, 40, and 45. Data storage devices 50, 55, 60 and 65 are located in section 35. In the diagram two tape drives 50 and 55, and two magnetic disk drives 60 and 65 are shown. However, the devices may comprise any combination of devices such as magnetic tape drives, magnetic disk drives, or optical disk drives. Each of the data storage devices is located in a device bay 80 defined by a divider 70 and is held in place by mounting rails 75. In this embodiment the devices are hard-wired into the storage system. However, low insertion force plugs and sockets could be used to provide electrical connections to the devices. Because each device is of a standard size (5.25 inch form factor), it would theoretically be possible to put a device into any one of the bays 80. Also, although the diagram shows storage devices corresponding to each of the device bays 80, it is possible to configure the data storage system 10 such that one or more of the device bays does not contain a storage device. In this embodiment an empty bay would be substantially blanked off using a shutter, to prevent an imbalance in the cooling air flow.

When all four storage devices or blanking shutters have been positioned in corresponding bays 80, a front panel 30 having apertures 135 is mounted on chassis 20. If the user does not require access to the front of the devices (the case with hard disk drives), grills 85 may be mounted on front panel 30 covering apertures 135, to allow cooling air to enter the drawer and to improve the appearance of the data storage system. The air flow past a device which presents a particularly high air flow impedance may be improved by opening slots 137 in panel 30.

Figure 4:
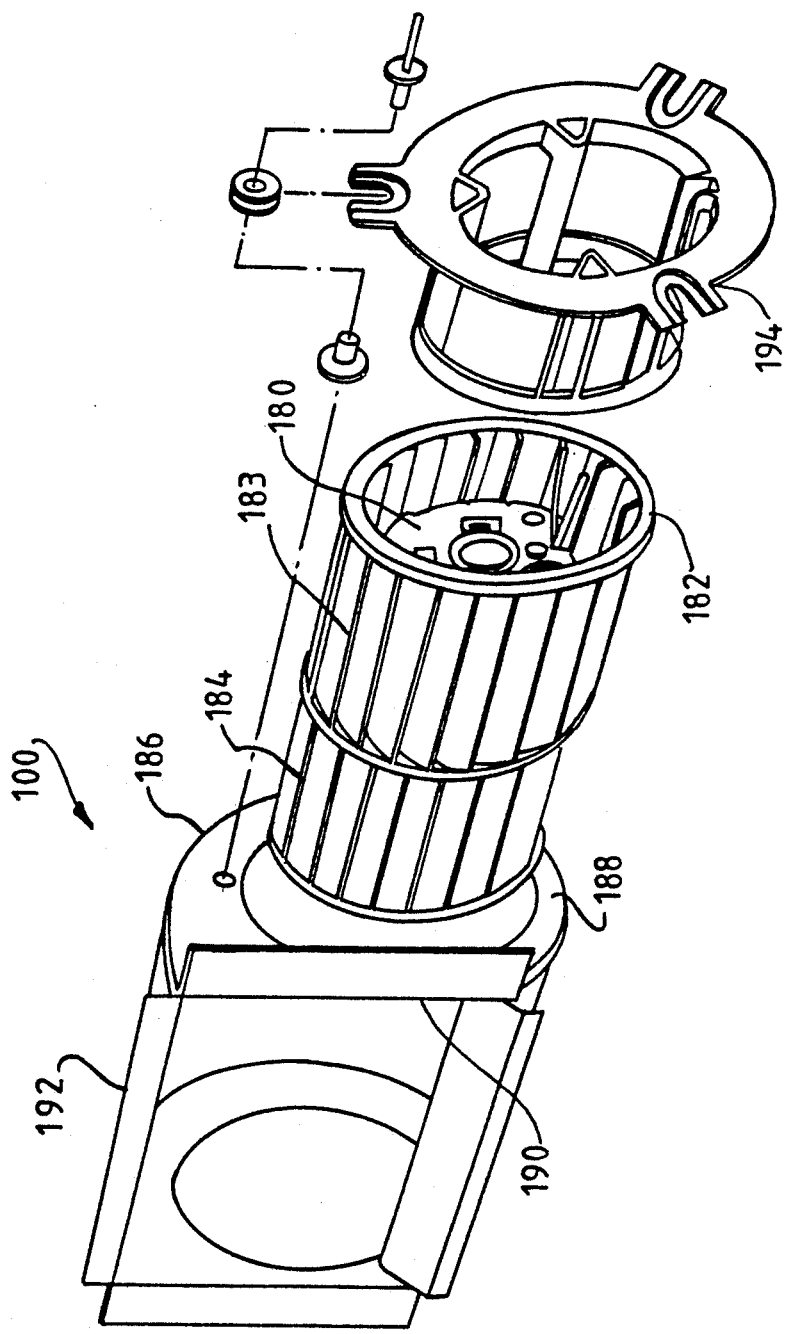
FIG. 4 is an exploded view of a dual entry centrifugal fan used to provide forced air cooling of the data storage system.

Section 40 of the chassis 20 houses the cooling fans and also much of the cabling associated with the storage devices. In this embodiment, two dual entry centrifugal fans 100 driven by open loop brushless direct current ("BLDC") motors are used to force cooling air through the storage system 10. The fans 100 are of the type described in UK Patent Application number 8916214.3; one such fan is shown in FIG. 4. The fans 100 are mounted on mounting plate 105 which is then attached to frame 110. The fans 100 are arranged to draw cooling air through the grills 85 or slots 137 on front panel 30, and over the storage devices located in bays 80, into a plenum. From the plenum, the air enters the dual inlets of fans 100, and is then forced through vents in the mounting plate 105 into section 45 of chassis 20 which houses the power supply unit 115. The cooling air finally exhausts through outlet vents 120 in backplate 125, and also through vents (not shown) in the power supply unit 115.

Figure 2:
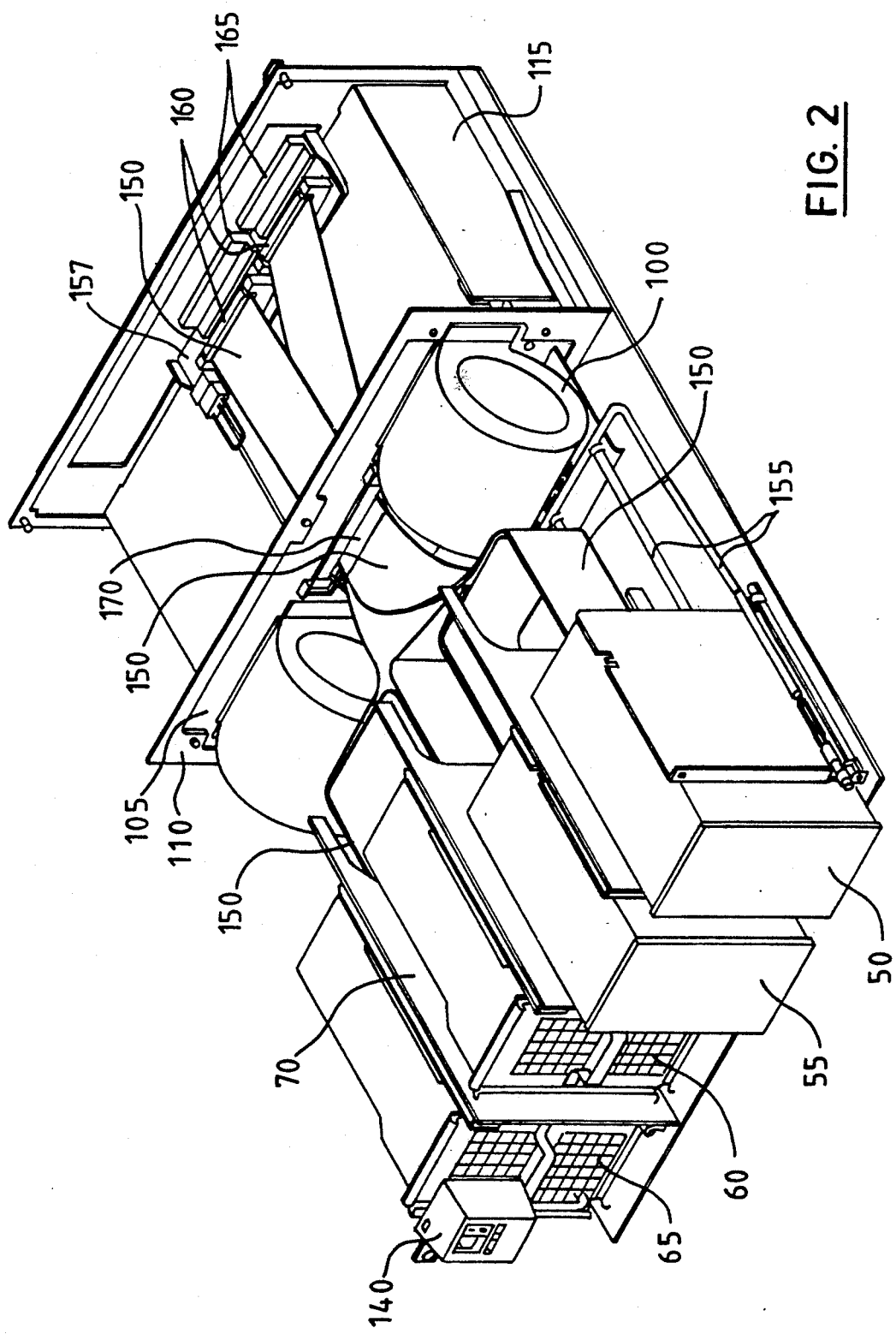
FIG. 2 is another isometric view of the data storage system shown in FIG. 1, showing in particular the layout of the system cables.

FIG. 2 is another isometric view of the data storage system. In this figure, the layout of the cables carrying signals to and from data storage devices 50, 55, 60 and 65 is shown. For clarity, certain other parts are omitted from FIG. 2.

Two sets of cables are used in the data storage system; flat, multiconductor ribbon cables 150 are used to carry data and control information to and from the data storage devices, and smaller cables 155 are used to carry power to the devices.

Data is passed to and from the data storage system via external multiway connectors 165. These connectors are mounted on a sub assembly 157 and are electrically connected to corresponding internal multiway connectors 160. The cables 150 are attached to connectors 160 and pass over the power supply unit 115 into slot 170. Slot 170 includes a flap mechanism to prevent the flow of air through the slot. The cables emerge from slot 170 and pass between the fans 100 to reach the data storage devices. Apart from the fan outlets this slot is the only aperture in the mounting plate 105 which thus acts as a bulkhead against leakage of air around the fans.

In the present embodiment a "daisy-chain" system of cabling is used. In other words a single, continuous cable starts at one of the internal connectors 160, connects to each of the data storage devices in turn, and then returns to the other one of the internal connectors 160.

Figure 3:
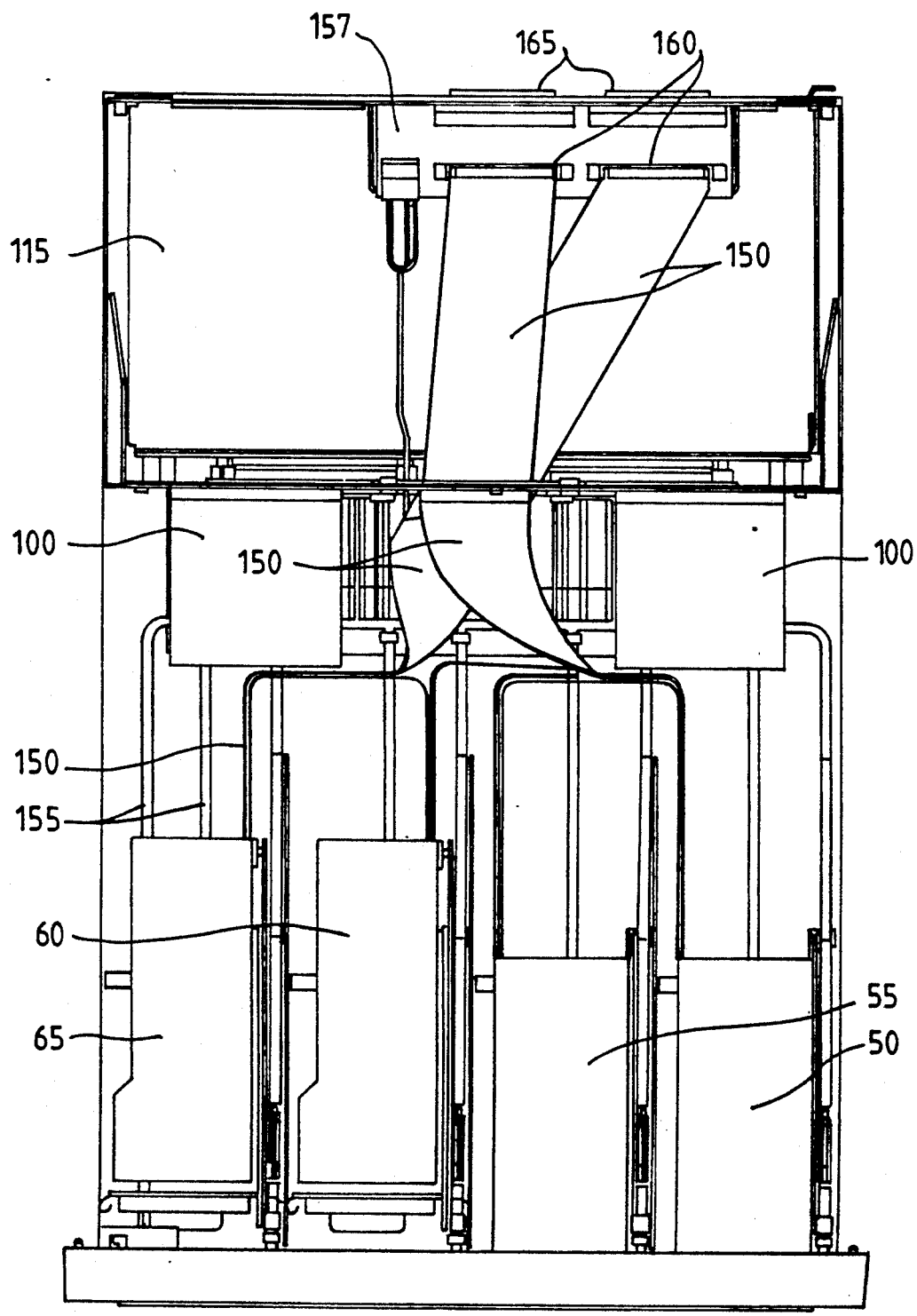
FIG. 3 is a plan view of the data storage system shown in FIG. 2.

FIG. 3 shows a plan view of the data storage system, with the lid 25 removed for clarity. Again, the path of the ribbon cable 150 is shown.

Although FIGS. 2 and 3 are drawn to show a very tidy cable arrangement, it should be noted that, in the present embodiment, the cables are not constrained to lie in the paths shown. The chassis 20 has a tubular construction; this means that when the data storage system is assembled the cable 150 must be long enough that connections can be made to the storage devices with the devices removed from the chassis. When the devices are subsequently positioned in bays 80, the cable is pushed back into the chassis, so that it is loosely bunched in section 40. Because of this bunching, it is possible that a portion of the cable may partially block one of the fan entries.

FIG. 4 is an exploded view of one of the fans 100. The fan is driven by a brushless direct current motor; in the figure this is hidden by the motor control printed circuit board 180. The motor drives an impeller 182, comprising fan blades 183 and 184. The fan is assembled into a scroll 186 having side walls 188. The rectangular output aperture 190 is surrounded by out-turned mounting flanges 192. The motor/impeller assembly is held in place by the annular outer plate 194. In operation, air is taken into the fan through the aperture in each end plate 194, and is exhausted through the outlet 190.

Figure 5:
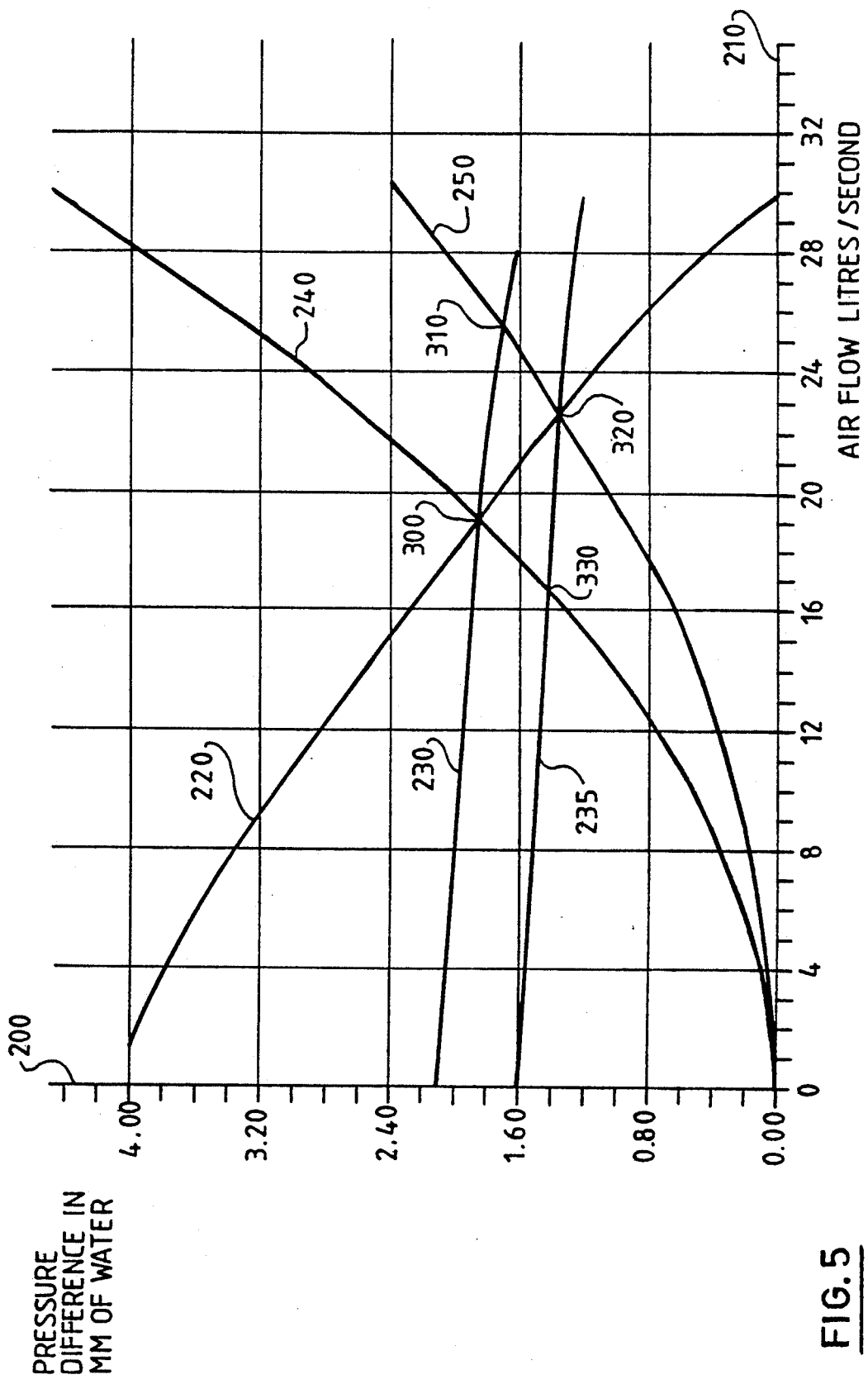
FIG. 5 is a graph showing pressure difference against air flow in the data storage system.

FIG. 5 shows a graph of pressure difference in mm of water (axis 200) against air flow in liters per second (axis 210).

In this embodiment of the present invention, two BLDC centrifugal fans are used to provide forced air cooling of the data storage system. However, in order to illustrate some of the advantages of the present invention, the performance of constant speed axial fans in an otherwise similar storage system will also be discussed below, for comparison purposes.

Two families of curves are displayed: curves 220, 230 and 235 represent typical fan performances (in this case the pressure difference on axis 200 is the fan back pressure), while curves 240 and 250 show the relationship between the pressure difference across an impedance and air flow through that impedance, for systems having two different impedances.

The relationship between the air flow Q, through an impedance Z, and the pressure difference delta p across that impedance is given by:

$$\text{delta } p = Z Q^2$$

This quadratic equation is plotted as curves 240 and 250, showing this relationship for a high and a low impedance respectively. The high impedance curve 240 corresponds to a data storage system having three tape drives and one blanking shutter mounted in bays 80. The low impedance curve 250 corresponds to a storage system having four disk drives.

Curves 220, 230 and 235 show the performance of typical cooling fans. The curves show the fan back pressure plotted against the air flow through the fan for typical constant speed axial fans (curves 230 and 235) and a BLDC centrifugal fan as described above (curve 220). Both types of fan have the property that the air flow increases as the fan back pressure decreases. However, whereas the rotational speed of the axial fan is constant over the range of back pressures shown, the rotational speed of the BLDC centrifugal fan tends to decrease as the fan back pressure decreases.

In the data storage system, the storage devices each require a certain minimum flow of cooling air for reliable operation. However it is preferable, for ease of manufacture, that the same fans can be installed for each possible configuration of storage devices. Therefore the fans 100 are selected in order that this minimum flow is provided under the "worst case" conditions. In fact two sets of worst case conditions are considered. The first is when the combination of data storage devices presenting the highest impedance to the flow of cooling air is installed in bays 80 (the "highest impedance" combination), and the second occurs when the combination of devices requiring the highest flow of cooling air (the "highest flow" combination) is installed. In the present embodiment, the highest impedance combination of devices is considered to be that of three tape drives and one blanking shutter. In this case a minimum of 18.3 liters per second ("l/s") of cooling air must flow through the system. The highest total flow (22.7 l/s) is required by by a system comprising four disk drives.

Accordingly, for the highest impedance combination, a fan is selected such that its performance curve (220 or 230) crosses the impedance curve 240 (which corresponds to the highest impedance combination of devices) at an intersection 300 corresponding to an air flow on axis 210 of at least 18.3 l/s. Thus the two fan performance curves shown in FIG. 5 which pass through point 300 (curves 220 and 230) relate to particular fans capable of providing at least 18.3 liters of air per second through the system under the highest impedance conditions, i.e. when three tape drives and one blanking plate are installed in bays 80.

As mentioned above, the other requirement of the cooling fans is that sufficient air must be drawn through the highest flow combination of storage devices. FIG. 5 also shows curve 250, the impedance curve corresponding to such a highest flow system having four disk drives installed in bays 80. The impedance of this combination of devices is much lower than that of the highest impedance combination described above. However, the air flow requirement of this combination is much higher. In the case of the highest flow combination, the operating conditions of the cooling fan may be found by noting the point at which the impedance curve 250 crosses the fan characteristic curve.

For the constant speed axial fan described by curve 230, the fan characteristic curve crosses the impedance curve 250 at intersection 310. By reading the coordinates of intersection 310 on axes 200 and 210, the operating conditions of the fan are found. These conditions are that the axial fan provides an air flow of 25.5 l/s, at a back pressure of 1.7 mm of water. This air flow is greater than the 22.7 l/s required by the four disk drives.

The operating conditions of the BLDC centrifugal fan in the lower impedance system are shown by the intersection 320 of the fan performance curve 220 and the impedance curve 250. Intersection 320 corresponds to a fan backpressure of approximately 1.55 mm of water and an air flow of approximately 22.7 l/s.

It can be seen that although both the constant speed axial fan and the BLDC centrifugal fan were selected to provide the same minimum air flow under the highest impedance conditions (i.e. 18.3 l/s), the air flow under lower impedance (highest flow) conditions is different for the two fan types. Under these latter conditions, 22.7 l/s must flow through the system. This is provided by the BLDC fan but exceeded by the constant speed axial fan (curve 230). It can be advantageous to exceed the minimum required flow by as little as possible, since this may lessen the risk of blowing dirt or other contaminants onto the storage devices and power supply unit.

Curve 235 relates to another constant flow axial fan selected primarily to provide the minimum required flow (22.7 l/s) under the highest flow conditions. The characteristic curve 235 passes through intersection 320, corresponding to a flow of 22.7 l/s. Again, the operating parameters of this fan under highest impedance conditions may be determined by finding the intersection 330 of curve 235 and impedance curve 240. It may be seen from FIG. 5 that intersection 330 corresponds to a flow of only 17 l/s. This flow would be insufficient to cool the tape drives under the highest impedance conditions.

It should also be noted that the rotational speed of the BLDC fan decreases as the system impedance is reduced from the worst case impedance (curve 240) to a lower impedance such as that corresponding to curve 250. When the BLDC fan is operating under conditions specified by intersection 300 its rotational speed is 1450 revolutions per minute ("rpm"). At intersection 320 the BLDC's rotational speed has dropped to 1400 rpm. This corresponds to a reduction in fan noise of about 1 dB.

By contrast, it will be apparent that in a data storage system incorporating constant speed axial fans, the fan speed, and therefore the fan noise, is substantially independent of the air flow impedance of the storage devices installed in bays 80. Thus a constant speed fan selected to provide 18.3 l/s under highest impedance conditions (intersection 300 and curve 230) is unnecessarily powerful and noisy when used under lower impedance (highest flow) conditions. This gives rise to additional fan noise under the lower impedance conditions. Alternatively a constant speed axial fan selected to satisfy but not to exceed the highest flow requirement (curve 235 and intersection 320) does not provide sufficient cooling air under the highest impedance conditions (intersection 330).

The fact that the rotational speed of the BLDC fan reduces when the air impedance of the devices in bays 80 reduces is particularly advantageous when a lower impedance device (in this case, a disk drive) is noisier than a high impedance device (a tape drive). In these circumstances, the increase in the noise of the data storage system resulting from the installation of a disk drive in place of a tape drive will be offset by the reduction in the rotational speed of the fans. However, even if the opposite situation applied, in that the noisier device also presented the higher air impedance, it would still be an advantage to minimise the system noise by running the fans at the lowest possible speed, while maintaining the minimum required air flow.

In this embodiment of the present invention dual entry BLDC centrifugal fans are used. This dual entry feature provides a further advantage relating to the reliability of the data storage system. As described in connection with FIGS. 2 and 3, since the ribbon cables to and from each data storage device pass through the section 40 of the chassis 20 in which the fans are housed. It is therefore possible that, in operation, a cable may partially or wholly obscure one of the fan entries, cutting the air flow through that entry. However, since this would increase the fan back pressure, the BLDC fan would speed up, thereby increasing the air flow through the other entry to compensate. This feature has been tested for the present embodiment; when one entry of one of the two fans was substantially blocked by a ribbon cable, the rotational speed of that fan increased by 100 rpm, and the overall air flow through the system decreased by only 1 l/s (a reduction of only about 5%). Therefore, if one of the four fan inlets is blocked in this way, the cooling system compensates, to maintain substantially the same air flow.

We claim:

1. Electrical apparatus including:
   a housing including a plenum extending substantially across the width of said housing and a receiving means located at one side thereof, said receiving means comprising a plurality of bays separated by dividing walls, each bay extending from one end of said housing to said plenum and being adapted to receive one of a plurality of interchangeable electrical units;
   fan means mounted within said housing behind the receiving means and drawing air from said plenum for producing an air flow through the housing past such electrical units, said fan means comprising a dual side entry open loop brushless direct current centrifugal fan positioned such that each fan entry is opposite one of said bays; and
   a power supply also mounted within said housing and located in the air flow path through the housing.

2. Apparatus as claimed in claim 1, in which the power supply and the receiving means are located on opposite sides of the fan means, which is arranged to draw air through the receiving means.

3. Apparatus as claimed in claim 1, in which the housing is of tubular construction, and in which the receiving means is substantially coextensive with one open end of the tubular housing.

4. Apparatus as claimed in claim 3, wherein the housing is a drawer for mounting in a rack.

5. Apparatus as claimed in claim 1, in which the fan means includes a plurality of dual side entry brushless direct current centrifugal fans, axially spaced across the width of the housing so that each fan entry is opposite one of said bays.

6. Apparatus as claimed in claim 5, further including at least one ribbon cable for connecting such electrical units to external connectors, which passes between a pair of the dual entry fans, the cable being loosely bunched in the vicinity of the fans so that adjacent inlets of the dual entry fans are susceptible to blockage as a result of movement of the cable.

7. Electrical apparatus including:
   a plurality of interchangeable electrical units, each unit being selected from a plurality of different unit types, each unit type having its own unique air flow impedance;
   a housing including a plenum extending substantially across the width of said housing and a receiving means located at one side thereof, said receiving means comprising a plurality of bays separated by dividing walls, each bay extending from one end of said housing to said plenum and being adapted to receive one of said plurality of electrical units, wherein each unit of said plurality of interchangeable units is mounted in a respective one of said bays;
   fan means mounted within said housing behind the receiving means and drawing air from said plenum for producing an air flow through the housing past such electrical units, said fan means comprising a dual side entry open loop brushless direct current centrifugal fan positioned such that each fan entry is opposite one of said bays; and
   a power supply also mounted within said housing and located in the air flow path through the housing.

8. Apparatus as claimed in claim 7, in which the power supply and the receiving means are located on opposite sides of the fan means, which is arranged to draw air through the receiving means.

9. Apparatus as claimed in claim 7, in which the housing is of tubular construction, and in which the receiving means is substantially coextensive with one open end of the tubular housing.

10. Apparatus as claimed in claim 9, wherein the housing is a drawer for mounting in a rack.

11. Apparatus as claimed in claim 7, in which the fan means includes a plurality of dual side entry brushless direct current centrifugal fans, axially spaced across the width of the housing so that each fan entry is opposite one of said bays.

12. Apparatus as claimed in claim 11, further including at least one ribbon cable connecting such electrical units to external connectors, which passes between a pair of the dual entry fans, the cable being loosely bunched in the vicinity of the fans so that adjacent inlets of the dual entry fans are susceptible to blockage as a result of movement of the cable.

* * * * *